(12) United States Patent
Gruber et al.

(10) Patent No.: US 10,229,885 B2
(45) Date of Patent: Mar. 12, 2019

(54) METHOD OF GALVANIC PLATING ASSISTED BY A CURRENT DISTRIBUTION LAYER

(71) Applicant: Infineon Technologies AG, Neubiberg (DE)

(72) Inventors: Martin Gruber, Schwandorf (DE); Steffen Jordan, Viehhausen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/426,158

(22) Filed: Feb. 7, 2017

(65) Prior Publication Data

US 2017/0229399 A1 Aug. 10, 2017

(30) Foreign Application Priority Data

Feb. 8, 2016 (DE) .................. 10 2016 102 155

(51) Int. Cl.
*H01L 23/538* (2006.01)
*H01L 23/58* (2006.01)
(Continued)

(52) U.S. Cl.
CPC ...... *H01L 23/5389* (2013.01); *C23C 18/1653* (2013.01); *C25D 7/00* (2013.01); *H01L 21/2885* (2013.01); *H01L 21/561* (2013.01); *H01L 21/568* (2013.01); *H01L 21/6835* (2013.01); *H01L 21/76802* (2013.01); *H01L 21/76873* (2013.01); *H01L 21/76877* (2013.01); *H01L 23/3114* (2013.01); *H01L 23/5384* (2013.01); *H01L 23/5386* (2013.01); *H01L 23/585* (2013.01); *H01L 24/00* (2013.01); *H01L 25/0655* (2013.01); *H01L 23/3107* (2013.01); *H01L 2221/68359* (2013.01)

(58) Field of Classification Search
CPC . H01L 21/2885; H01L 21/561; H01L 21/568; H01L 21/76873; H01L 21/76802; H01L 21/6835; H01L 21/78873; H01L 21/76877; H01L 23/5389; H01L 23/3114; H01L 23/5386; H01L 23/5384; H01L 23/585; H01L 25/585; H01L 2221/68359; C25D 7/00; C23C 18/1653
See application file for complete search history.

(56) References Cited

U.S. PATENT DOCUMENTS

| 2002/0111015 A1* | 8/2002 | Napolitano ......... H01L 21/2885 438/637 |
| 2008/0290469 A1* | 11/2008 | Grivna ................. H01L 23/585 257/620 |

(Continued)

FOREIGN PATENT DOCUMENTS

DE 102014115653 A1 5/2015

*Primary Examiner* — Cheung Lee
*Assistant Examiner* — Stephen C Smith

(57) ABSTRACT

The method comprises providing a plurality of electronic devices, embedding the electronic devices in an encapsulation layer, forming vias into the encapsulation layer, the vias extending from a main face of the encapsulation layer to the electronic devices, and depositing a metallic layer onto the encapsulation layer including the vias by galvanic plating, the method further comprising providing a current distribution layer for effecting a distributed growth of the metallic material during the galvanic plating.

14 Claims, 6 Drawing Sheets

(51) Int. Cl.
*C23C 18/16* (2006.01)
*C25D 7/00* (2006.01)
*H01L 21/56* (2006.01)
*H01L 21/683* (2006.01)
*H01L 21/768* (2006.01)
*H01L 23/00* (2006.01)
*H01L 25/065* (2006.01)
*H01L 21/288* (2006.01)
*H01L 23/31* (2006.01)

(56) References Cited

U.S. PATENT DOCUMENTS

2009/0056994 A1* 3/2009 Kuhr .................. C23C 18/1653
 174/259
2012/0199971 A1 8/2012 Shim et al.
2015/0332938 A1* 11/2015 Palm .................. H01L 23/4334
 257/723

* cited by examiner

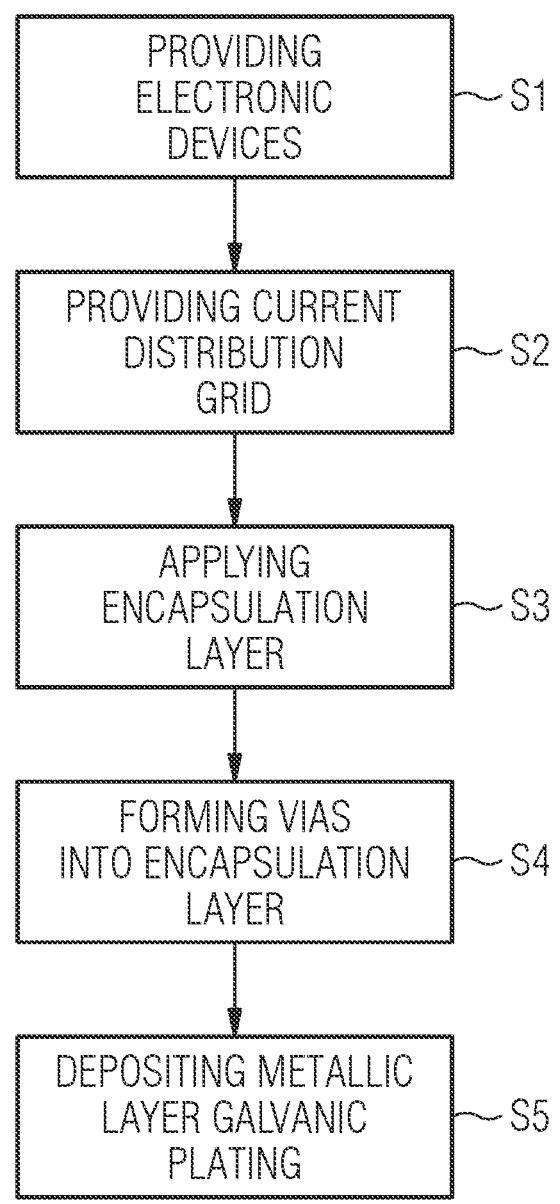

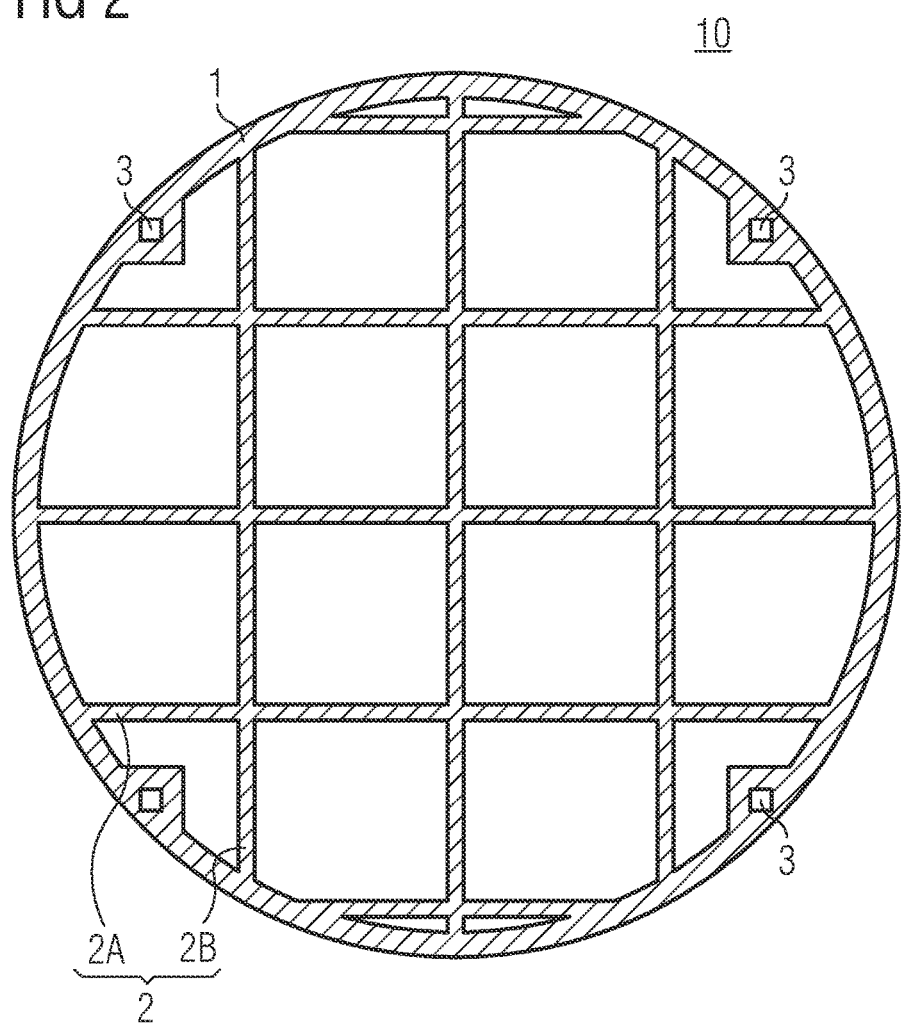

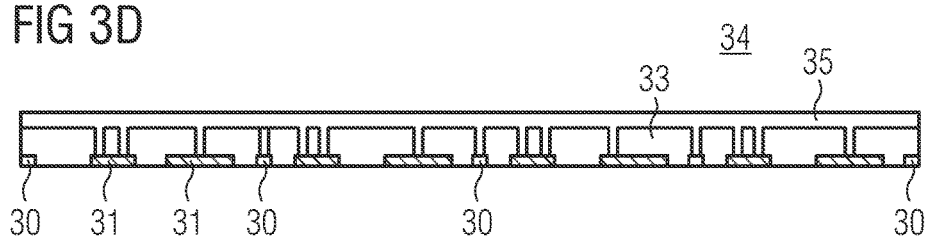
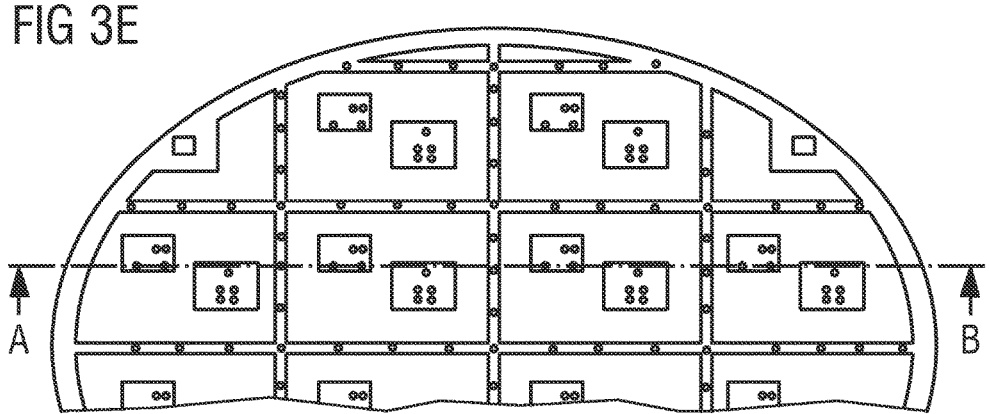

METHOD OF GALVANIC PLATING ASSISTED BY A CURRENT DISTRIBUTION LAYER

TECHNICAL FIELD

The present disclosure relates to a method for fabricating an electronic device package, to a method for depositing a metallic layer, and to an electronic device package.

BACKGROUND

In the course of the processing of an electronic device package, for example, very often a metallic layer has to be deposited on the whole area of an intermediate product. In particular, in case of extended wafer level packaging a metallic layer needs to be deposited over the whole area of an intermediate product having the size of an artificial wafer. Such a metallic layer may fulfill the function of a redistribution layer (RDL) for redistributing the spatial arrangement of electrical contact pads of electronic devices like, for example, semiconductor chips.

For depositing metallic layers galvanic plating has proven to yield metallic layers of high quality and homogeneity, in particular when utilized for depositing metallic layers on surfaces comprising depressions or holes. Problems may arise, however, when the area to be covered with the metallic layer becomes very large.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

FIG. 1 shows a flow diagram of a method for fabricating an electronic device package according to a first aspect including providing a plurality of electronic devices and a current distribution grid and applying an encapsulation layer over the electronic devices and the current distribution grid.

FIG. 2 shows a top view representation of a current distribution grid according to an example, in particular for use together with an 8 inch eWLB wafer.

DETAILED DESCRIPTION

Figure 3A:
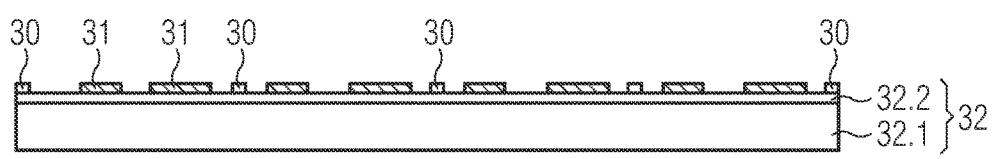
FIG. 3 comprises FIGS. 3A to 3E and shows a top view representation of an upper part of a wafer level package fabricated by a method according to the first aspect (FIG. 3E) and cross-sectional side view representations along a plane as indicated by the line A-B in FIG. 3E for illustrating a method for fabricating the wafer level package (FIGS. 3A to 3D).

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the claims. It should be noted further that the drawings are not to scale or not necessarily to scale.

In the following detailed description, reference is made to the accompanying drawings, which form a part hereof, and in which is shown by way of illustration specific aspects in which embodiments may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the claims. The following detailed description, therefore, is not to be taken in a limiting sense, and the scope is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope is defined by the appended claims.

The examples of an electronic device package and a method for fabricating an electronic device package may use various types of transistor devices. The examples may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The examples may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures. Insofar as the transistor chips are configured as power transistor chips and if in addition also driver chips are integrated into the package, the examples of an electronic device package disclosed further below can be classified as intelligent power modules (IPM).

In any case the electronic devices, e.g. the semiconductor dies or semiconductor chips, may comprise contact elements or contact pads on one or more of their outer surfaces wherein the contact elements serve for electrically contacting the semiconductor dies. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned materials.

The examples of an electronic device package may comprise an encapsulant or encapsulating material having the semiconductor transistor chips and the at least one semiconductor driver chip embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example.

The examples of a method for fabricating an electronic device package and of an electronic device package may comprise the forming of a metallic layer onto the encapsulation layer, including filling conductive material into vias of the encapsulation layer. The metallic layer may in particular have the function of a redistribution layer (RDL) which is configured to redistribute or re-arrange the spatial distribution or arrangement of the electrical contact pads of the electronic devices. The redistribution layer may be disposed on an upper surface of the encapsulation layer and may comprise a plurality of metallic traces, each one of the metallic traces being connected with an electrical contact pad by a via connection formed in the encapsulation layer.

In so far as methods for fabricating an electronic device package and for depositing a metallic layer are described as having a specific order of method steps, it should be mentioned that any other appropriate order of the method steps may be employed by the skilled person.

FIG. 1 comprises a flow diagram for illustrating a method for fabricating an electronic device package according to a first aspect. The method comprises providing a plurality of electronic devices (s1), providing a current distribution grid comprising a plurality of current distribution rails (s2), applying an encapsulation layer over the electronic devices and the current distribution grid (s3), forming vias into the encapsulation layer, the vias extending from a main face of the encapsulation layer to the electronic devices and to the current distribution grid (s4), and depositing a metallic layer onto the encapsulation layer including the vias by galvanic plating (s5).

It has been shown previously that the deposition of metallic layers onto large areas as required in, for example extended wafer level packaging, may lead to unsatisfying results when performed by galvanic plating as soon as the growth of the metallic layer only starts from edge portions of the wafer and continues from there in the direction of the center. The results were characterized by an inhomogeneous metallic layer having significant thickness variations and in the worst case very poor or even no metallic growth in the center of the wafer. Therefore, a current distribution grid, as described throughout the present disclosure, may help to effect a distributed growth of the metallic material during the galvanic plating. As will be shown in further detail below, the vias can be distributed spatially in such a way so as to allow a homogeneous growth of the metallic layer.

According to an example of the method according to the first aspect, the electronic devices are disposed in a spatially regular arrangement and the current distribution grid is disposed relative to the electronic devices in such a way that the electronic devices are at least in part surrounded by the current distribution rails. In particular the electronic devices and the current distribution grid are disposed on an auxiliary carrier and afterwards the encapsulation layer is applied onto both the electronic devices and the current distribution grid.

According to an example of the method according to the first aspect, providing the current distribution grid comprises prefabricating the current distribution grid, in particular so as to obtain a freely hand able current distribution grid which can be disposed as a whole onto the auxiliary carrier.

According to an example of the method according to the first aspect, providing the current distribution grid comprises either one of printing, sputtering or plasma-dust deposition of an electrically conductive layer onto the auxiliary layer. In connection with these fabrication methods a mask can be positioned above the substrate wherein the openings of the mask define the form of the current distribution grid to be fabricated. The electrically conductive layer can then be deposited through the openings of the mask. It is also possible to move a squeegee or doctor blade across the mask and to press the electrically conductive material into all unmasked areas.

According to an example of the method according to the first aspect, the current distribution grid comprises a circumferential ring-like current distribution rail and a plurality of linear current distribution rails, each one of the linear current distribution rails being connected between two points of the circumferential ring-like current distribution rail. According to a further example thereof, the plurality of linear current distribution rails comprises first linear current distribution rails extending in parallel along a first direction, and second linear current distribution rails extending in parallel along a second direction perpendicular to the first direction. It may be further the case that the distance between adjacent first linear current distribution rails is constant and also the distance between adjacent second linear current distribution rails is constant so that as a result a plurality of rectangular shaped areas is obtained, each one of the rectangular shaped areas including an equal number of electronic devices.

According to an example of the method according to the first aspect, the current distribution grid comprises a thickness in a range from 10 µm to 500 µm. The thickness can be constant over the whole current distribution grid. Alternatively, the thickness may be different as, for example, the outer circumferential current distribution rail may have a greater thickness than the linear current distribution rails for stability reasons. It is also possible that the linear current distribution rails may have different thicknesses. It is further possible that individual current distribution rails may have a laterally varying thickness. A specific example thereof will be shown and explained later.

According to an example of the method according to the first aspect, is fabricated of copper.

According to an example of the method according to the first aspect, the current distribution rails comprise a width in a range from 1 mm to 30 mm.

According to an example of the method according to the first aspect, disposing the electronic devices comprises placing the electronic devices onto an auxiliary carrier and also disposing the current distribution grid comprises placing the current distribution grid onto the auxiliary carrier. The auxiliary carrier may comprise a metallic plate, in particular a steel plate, and onto the metallic plate a double-sided adhesive foil like, for example, a thermo-release foil, can be applied so that the electronic devices and the current distribution grid can be placed onto the adhesive foil.

According to an example of the method according to the first aspect, forming the vias comprises forming first vias extending from a main face of the encapsulation layer to electrical contact pads of the electronic devices. According to a further example thereof, the first vias comprise diameters in a range from 200 µm to 600 µm.

According to a further example of the method according to the first aspect, forming the vias comprises forming second vias extending from a main face of the encapsulation layer to an upper surface of the current distribution grid. According to a further example thereof, the second vias comprise diameters in a range from 0.5 mm to 1.5 mm. According to a further example thereof, the second vias are evenly spaced from each other along the current distribution rails.

According to an example of the method according to the first aspect, the vias are formed by laser drilling into the encapsulation layer.

According to an example of the method according to the first aspect, filling conductive material into the vias comprises depositing a seed layer onto the encapsulation layer and into the vias, followed by galvanic plating. According to a further example thereof, the seed layer is comprised of an organic seed layer. According to a further example thereof, the seed layer is deposited by wet chemical deposition.

According to an example of the method according to the first aspect, an extended wafer level package is fabricated and after depositing the metallic layer onto the encapsulation layer and possible further steps, the extended wafer level package is singulated into a plurality of electronic device packages. According to a further example thereof, singulating the extended wafer level package is carried out in such a way that nothing of the current distribution grid is left in the singulated electronic device packages. This can be accomplished by either removing the current distribution grid by, for example, etching or by dicing adjacent to the edges of the current distribution rails. According to another example, singulating the extended wafer level package is carried out in such a way that specific parts of the current distribution grid are left in the electronic device packages, thereby fabricating electronic device packages which will be described by examples in further detail below. The left behind specific parts of the current distribution grid may be configured such that they can be used in operation of the electronic device package as one or more of a heat sink or an electrical connector.

FIG. 2 shows an example of a current distribution grid in a top view representation. The current distribution grid 10 of FIG. 2 is configured to be employed in an extended wafer level fabrication process together with an 8 inch eWLB wafer. The current distribution grid 10 of FIG. 2 comprises a circumferential ring-like current distribution rail 1 and a plurality of linear current distribution rails 2, each one of the linear current distribution rails 2 being connected between two points of the circumferential ring-like current distribution rail 1. The linear current distribution rails 2 comprise first linear current distribution rails 2A extending in parallel to each other along a first horizontal direction, and second linear current distribution rails 2B extending in parallel to each other along a second vertical direction perpendicular to the first direction. According to the example shown in FIG. 2, the current distribution grid 10 comprises three first linear current distribution rails 2A and three second linear current distribution rails 2B. The current distribution grid 10 is, for example, configured as a prefabricated, freely manageable current distribution grid 10 and, for example, comprises a diameter of 200 mm, and is further fabricated of copper comprising a thickness around 100 µm. The current distribution grid 10 of FIG. 2 may further comprise positioning aids 3 which help to dispose the current distribution grid 10 onto the carrier in an exact relative position to the electronic devices.

Figure 3B:
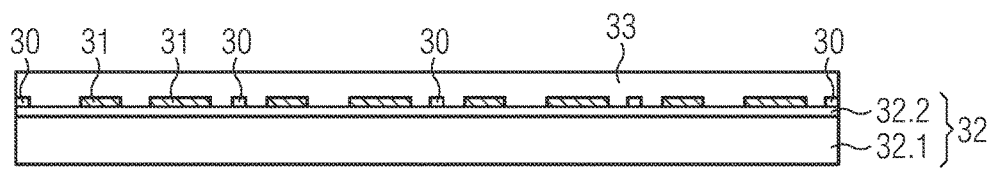
Figure 3C:
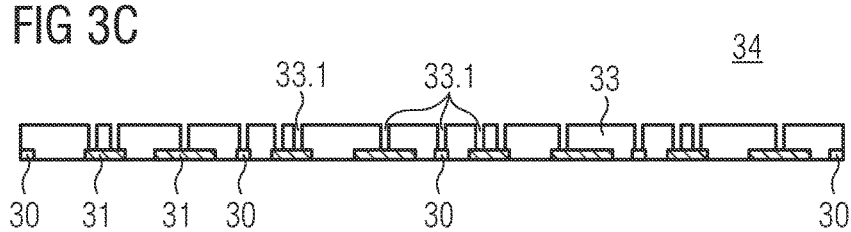

FIG. 3 comprises FIGS. 3A to 3E and illustrates a method for fabricating an electronic device package according to an example. The cross-sectional side view representations of FIGS. 3A to 3D are taken along a plane indicated by line A-B in FIG. 3E which shows an upper part of the fabricated wafer level package.

According to FIG. 3A a plurality of electronic devices 31 (drawn hatched) and a current distribution grid 30 are placed on an auxiliary carrier 32. The carrier 32 comprises a metallic plate 32.1 and an adhesive foil 32.2, in particular a thermo-release foil 32.2, attached to a main surface of the metallic plate 32.1. The electronic devices 31 may comprise electrical contact pads (not shown) arranged at an upper main face remote from the carrier 32. The current distribution grid 30 can be formed like the current distribution grid 10 as shown and described in connection with FIG. 2. The electronic devices 31 can be one or more of semiconductor chips or passive devices wherein the semiconductor chips can be one or more of transistor chips, driver chips, processor chips, or any other semiconductor chips. The electronic devices 31 can be arranged in a regular manner. The top view of FIG. 3E shows an example of arranging the electronic devices 31. Also shown in FIG. 3E is the positioning of the electronic devices 31 in relation to the current distribution grid 30. In the present example the wafer level package is partitioned into a plurality of similar regions, wherein each region is intended to become an electronic device package, each region includes two electronic devices surrounded by current distribution rails 30.1 of the current distribution grid 30.

According to FIG. 3B, an encapsulation layer 33 is applied onto the electronic devices 31, the current distribution grid 30 and the auxiliary carrier 32. The encapsulation layer 33 will be applied in such a way that it comprises a prescribed thickness above the electronic devices 31 and the current distribution grid 30.

According to FIG. 3C, after curing the encapsulation layer 33, the auxiliary carrier 32 can be removed and a wafer level package 34 is obtained. Thereafter vias 33.1 are formed into the encapsulation layer 33, the vias 33.1 reaching from an upper main face of the encapsulation layer 33 to the electrical contact pads of the electronic devices 31 and to the current distribution grid 30. The locations of the vias 33.1 are shown in FIG. 3E and it can be seen that the vias 33.1 to the current distribution grid 30 are placed along the current distribution rails 30.1 with constant distance between adjacent vias 33.1. The forming of the vias 33.1 can be performed by, for example, laser drilling.

According to FIG. 3D, after forming the vias 33.1 a metallic layer 35 of, for example, copper is deposited onto the encapsulation layer 33 and the vias 33.1 by galvanic plating. As a first step an organic seed layer (not shown) is applied to the encapsulation layer 33 and the vias 33.1 by wet chemical deposition. Thereafter in a second step the galvanic plating is carried out in such a way that the vias 33.1 are not completely filled by the metallic material but the bottom of the via and the side wall are covered by the metallic material with a certain prescribed thickness.

Thereafter a few more steps may follow like, for example, applying a solder resist layer and external contact elements. In a last step the wafer level package will be singulated to obtain a plurality of electronic device packages. According to an example, the current distribution grid 30 is removed before singulation by, for example, etching. It is, however, also possible to leave the current distribution grid 30 at the wafer level package. The step of singulating can be done in such a way that the obtained electronic device packages do not include any residues of the current distribution grid 30. It is, however, also possible that parts of the current distribution grid 30 are left in the electronic device packages and utilized in operation of the electronic device packages for purposes of one or more of electrical functions and heat sink functions.

The present disclosure also relates to a method for fabricating an electronic device package according to a second aspect. The method according to the second aspect comprises providing a plurality of electronic devices, embedding the electronic devices in an encapsulation layer, forming vias into the encapsulation layer, the vias extending from a main face of the encapsulation layer to the electronic devices, and depositing a metallic layer onto the encapsulation layer including the vias by galvanic plating, the method further comprising providing a current distribution layer for effecting a distributed growth of the metallic material during the galvanic plating.

According to an example of the method according to the second aspect, the method comprises providing the current distributing layer in the same plane as the electronic devices. According to a further example thereof, the current distribution layer can be provided in the form of a current distribution grid wherein the current distribution grid can also be embedded in the encapsulation layer. According to a further example thereof, both the electronic devices and the current distribution grid are disposed on an auxiliary carrier and the encapsulation layer is applied onto the electronic devices, the current distribution grid and the auxiliary carrier.

According to an example of the method according to the second aspect, the method further comprises providing the current distributing layer in another plane as the electronic devices. According to a further example thereof, the current distribution layer comprises the form of a current distribution grid such as that shown in, for example, FIGS. 2 and 3. According to another example, the current distributing layer does not comprise the form of a current distribution grid such as that shown in, for example, FIGS. 2 and 3. Instead the current distribution layer can have another form of a metallic layer which can also be embedded in the encapsulation layer or can be comprised of a carrier, in particular a carrier supporting the semiconductor chips. The current distribution layer can in this case be comprised of a full area metal layer or a leadframe, for example. In this case also vias could be formed from an upper face of the encapsulation layer to the current distribution layer. For example, when comparing with FIGS. 3B and 3C, the current distribution layer could be located underneath the plane of the electronic devices 31 and the vias could be formed into the encapsulation layer so that they would pass between the electronic devices 31 until they reach the current distribution layer.

Further examples of the method according to the second aspect can be formed by incorporating examples and features which were described before in connection with the method according to the first aspect.

The present disclosure also relates to a method for depositing a metallic layer according to a third aspect. The method according to the third aspect comprises providing a material layer, and depositing a metallic layer onto the material layer by galvanic plating, the method further comprising providing a current distribution layer for effecting a distributed growth of the metallic material during the galvanic plating.

According to an example of the method of the third aspect, providing the material layer comprises applying the material layer over the current distribution layer, and forming vias into the material layer, the vias extending from a main face of the material layer to the current distribution layer.

According to an example of the method of the third aspect, the current distribution layer can have the form of a current distribution grid such as that shown and described in connection with FIGS. 2 and 3 of the present disclosure. According to another example, the current distribution layer can have the form of a full area metallic plane or any other kind of metallic plane like, for example, a leadframe.

According to an example of the method of the third aspect, the material layer comprises the same or similar features as the encapsulation layer as described before in connection with the methods according to the first and second aspects.

Further examples of the method according to the third aspect can be formed by incorporating examples or features which were described before in connection with the methods according to the first and second aspects.

Figure 4A:
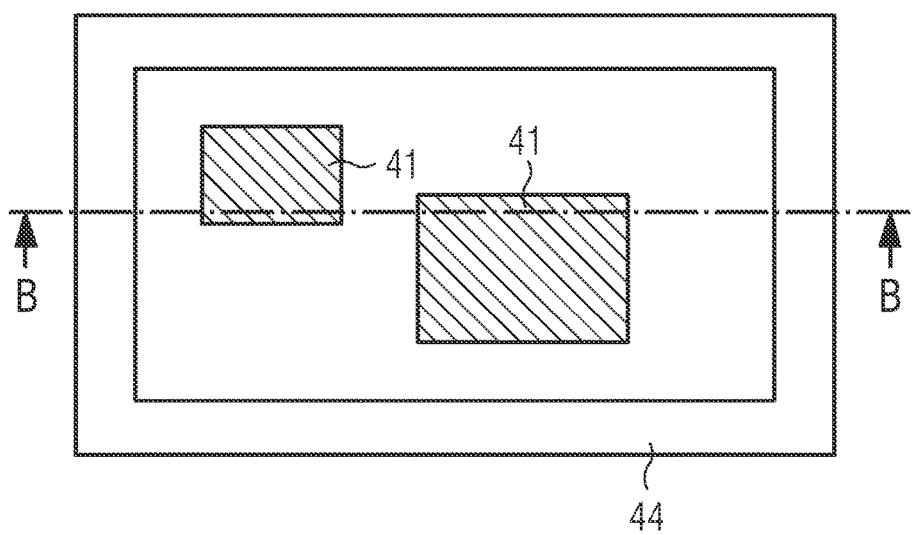
FIG. 4 comprises FIGS. 4A and 4B and shows a schematic top view representation of an electronic device package according to a fourth aspect, the electronic device package comprising a flat metallic rail (A), and a schematic cross-sectional side view representation of the electronic device package taken along a plane indicated by the line B-B in FIG. 4A (B).
Figure 4B:
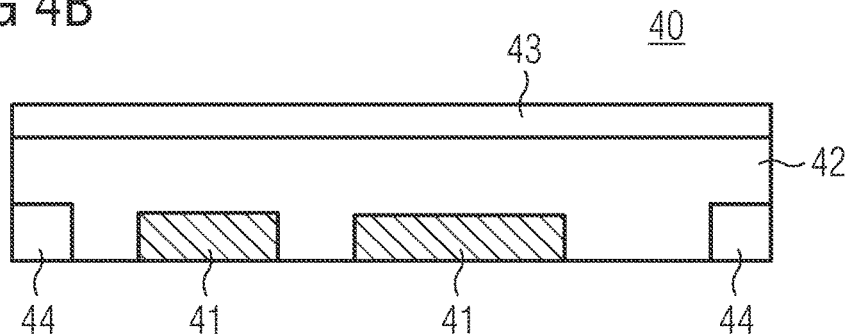

FIG. 4 comprises FIGS. 4A and 4B and shows an example of an electronic device package according to a forth aspect in a schematic top view representation (A) and a schematic cross-sectional side view representation (B). The electronic device package 40 of FIG. 4 comprises two semiconductor chips 41, an encapsulation layer 42 covering the semiconductor chip 41, a redistribution layer (RDL) 43 disposed above the encapsulation layer 42, and a metallic rail 44 extending along an edge of the encapsulation layer 42. Further elements or parts of the electronic device package 40 like, for example, vias between the RDL 43 and the chips 41 or external connectors disposed above the RDL 43, are omitted here for reasons of clarity.

The electronic device package 40 as shown in the example of FIG. 4 comprises a metallic rail 44 which has a peripheral ring-like configuration and thus extends along each one of the side edges of the encapsulation layer 42. Such an electronic device package 40 can, for example, be obtained by cutting the wafer level package as shown in FIG. 3E along center axes of the current distribution rails 30. The metallic rail 44 is thus a residue of the previous current distribution rail 30. It is, however also possible that the metallic rail 44 does not extend along all side edges of the encapsulation layer 42 but, for example, only one, two or three side edges of the encapsulation layer 42. The metallic rail 44 may thus comprise different parts which are not connected directly which each other.

According to an example of the electronic device package 40 of the forth aspect, the metallic rail 44 can be configured such that it can be utilized for specific purposes for the operation of the electronic device package 40. For example, the metallic rail 44 can be used as a heat sink assisting to dissipate excessive heat produced by one or more of the semiconductor chips 41. For this purpose the metallic rail 44 can be thermally connected with one or more of the semiconductor chips 41. It is also possible that the metallic rail 44 serves an electrical function in operation of the electronic device package 40. For this purpose the metallic rail 44 can be electrically connected with one or more of the semiconductor chips 41 or with the RDL 43. Cutting the wafer level package of FIG. 3E can be performed such that not only part of the current distribution rail is left as a part of the electronic device package but also at least one of the vias connecting the current distribution rail with the RDL. It is further possible that the metallic rail 44 comprises different parts not directly connected with each other, these different parts serving different functions, i.e. one or more of thermal and electrical functions.

Figure 5A:
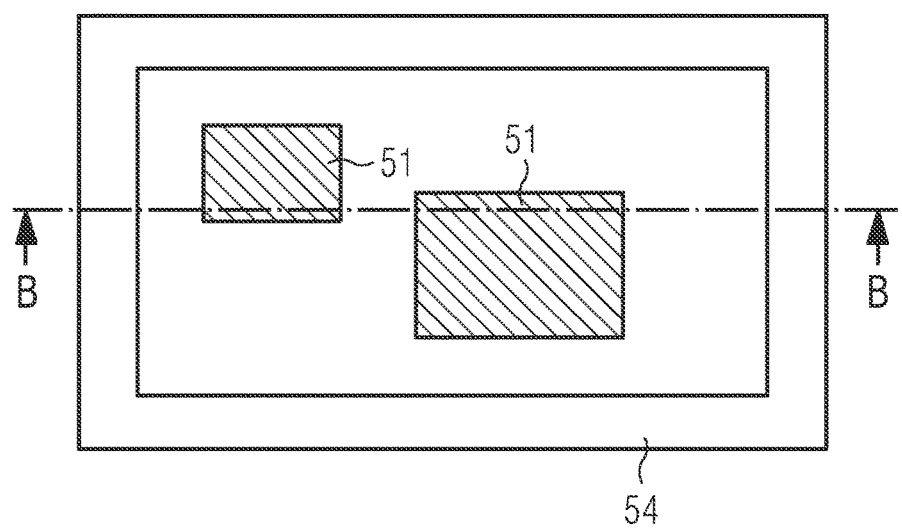
FIG. 5 comprises FIGS. 5A and 5B and shows a schematic top view representation of an electronic device package according to the fourth aspect, the electronic device package comprising a metallic rail having an upward extension (A) and a schematic cross-sectional side view representation of the electronic device package along a plane indicated by the line B-B of FIG. 5A (B).
Figure 5B:
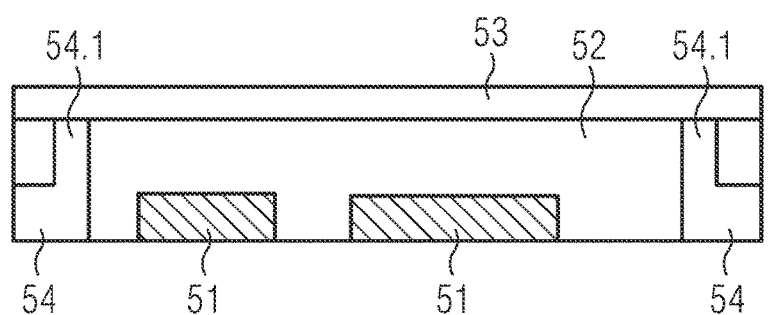

FIG. 5 comprises FIGS. 5A and 5B and shows another example of an electronic device package according to the forth aspect in a schematic top view representation (A) and a schematic cross-sectional side view representation (B). The electronic device package 50 of FIG. 5 comprises two semiconductor chips 51, an encapsulation layer 52 covering the semiconductor chip 51, a redistribution layer (RDL) 53 disposed above the encapsulation layer 52, and a metallic rail 54 extending along an edge of the encapsulation layer 52. Further elements or parts of the electronic device package 50 like, for example, vias between the RDL 53 and the chips 51 or external connectors disposed above the RDL 53, are omitted here for reasons of clarity.

The electronic device package 50 of FIG. 5 may comprise all features and properties as were described before in connection with the electronic device package 40 of FIG. 4. The electronic device package 50 of FIG. 5 differs from the electronic device package 40 of FIG. 4 in that the metallic rail 54 comprises an elevated portion 54.1 which is directly connected with the RDL 53. Such an elevated portion 54.1 may be useful to serve one or more of thermal and electrical functions of the metallic rail 54 in operation of the electronic device package 50. The elevated portion 54.1 may be obtained, for example, by providing a current distribution grid such as that shown in one of FIG. 2 or 3 in such a way that the individual current distribution rails comprise varying thicknesses, in particular comprise elevated portions on their longitudinal edges facing the chip regions. It is also possible that the current distribution rails in total have a thickness so that they reach until the RDL in which case no vias would have to be formed between the upper face of the encapsulation layer and the current distribution grid (see FIGS. 3B and 3C).

While embodiments have been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations.

The invention claimed is:

1. A method for fabricating an electronic device package, the method comprising:
   providing a plurality of electronic devices so that an extended wafer level package is provided;
   providing a current distribution grid comprising a plurality of current distribution rails for effecting a distributed growth of a metallic material during a galvanic plating;
   applying an encapsulation layer over the electronic devices and the current distribution grid;
   forming vias into the encapsulation layer, the vias extending from a main face of the encapsulation layer to the electronic devices and to the current distribution grid; and
   depositing a metallic layer onto the encapsulation layer including the vias by galvanic plating,
   removing the current distribution grid before singularizing the extended wafer level package to obtain electronic device packages.

2. The method according to claim 1, wherein providing the current distribution grid comprises prefabricating the current distribution grid.

3. The method according to claim 1, wherein the current distribution grid comprises a circumferential ring-like current distribution rail and a plurality of linear current distribution rails, each one of the linear current distribution rails being connected between two points of the circumferential ring-like current distribution rail.

4. The method according to claim 3, wherein the plurality of linear current distribution rails comprises first linear current distribution rails extending in parallel along a first direction, and second linear current distribution rails extending in parallel along a second direction perpendicular to the first direction.

5. The method according to claim 1, wherein disposing the electronic devices comprises placing the electronic devices onto a carrier.

6. The method according to claim 5, wherein disposing the current distribution grid comprises placing the current distribution grid onto the carrier.

7. The method according to claim 1, wherein forming the vias comprises forming first vias extending from a main face of the encapsulation layer to electrical contact pads of the electronic devices.

8. The method according to claim 7, wherein forming the vias comprises forming second vias extending from a main face of the encapsulation layer to an upper surface of the current distribution grid, the second vias being evenly spaced from each other along the current distribution rails.

9. The method according to claim 1, further comprising: forming the vias by laser drilling.

10. The method according to claim 1, wherein
filling conductive material into the vias comprises depositing an organic seed layer onto the encapsulation layer and into the vias, followed by galvanic plating.

11. The method according to claim 10, further comprising:
depositing the organic seed layer by wet-chemical deposition.

12. A method for fabricating an electronic device package, the method comprising:
providing a plurality of electronic devices so that an extended wafer level package is provided;
embedding the electronic devices in an encapsulation layer;
forming vias into the encapsulation layer, the vias extending from a main face of the encapsulation layer to the electronic devices; and
depositing a metallic layer onto the encapsulation layer including the vias by galvanic plating;
the method further comprising providing a current distribution layer for effecting a distributed growth of the metallic material during the galvanic plating,
removing the current distribution grid before singularizing the extended wafer level package to obtain electronic device packages.

13. The method according to claim 12, further comprising providing the current distributing layer in the same plane as the electronic devices.

14. The method according to claim 12, further comprising providing the current distributing layer in another plane as the electronic devices.

\* \* \* \* \*